United States Patent [19]

Lien et al.

[11] Patent Number: 5,393,677
[45] Date of Patent: Feb. 28, 1995

[54] METHOD OF OPTIMIZING WELLS FOR PMOS AND BIPOLAR TO YIELD AN IMPROVED BICMOS PROCESS

[75] Inventors: Chuen-Der Lien, Mountain View; Kyle W. Terrill, Sunnyvale; Jeong Y. Choi, Fremont, all of Calif.

[73] Assignee: Integrated Device Technology, Inc., Santa Clara, Calif.

[21] Appl. No.: 20,234

[22] Filed: Feb. 19, 1993

Related U.S. Application Data

[63] Continuation of Ser. No. 835,249, Feb. 13, 1992, abandoned.

[51] Int. Cl.$^6$ .......................................... H01L 21/265
[52] U.S. Cl. ........................................ 437/28; 437/31; 437/34; 437/59; 257/370
[58] Field of Search ............... 437/31, 34, 59, 150, 437/28; 257/370

[56] References Cited

U.S. PATENT DOCUMENTS

| | | | |
|---|---|---|---|
| 4,717,683 | 1/1988 | Parrillo et al. | 437/34 |
| 4,728,619 | 3/1988 | Pfiester et al. | 437/34 |
| 4,847,213 | 7/1989 | Pfiester | 437/34 |
| 4,889,825 | 12/1989 | Parrillo | 437/34 |
| 5,006,477 | 4/1991 | Farb | 437/34 |
| 5,023,193 | 6/1991 | Manoliu et al. | 437/57 |
| 5,024,961 | 1/1991 | Lee et al. | 437/34 |

*Primary Examiner*—Olik Chaudhuri
*Assistant Examiner*—Long Pham
*Attorney, Agent, or Firm*—Law Offices of Thomas E. Schatzel

[57] ABSTRACT

A first process embodiment of the present invention comprises the steps of implanting a blanket low dose n-well implant before field oxidation. A blanket n-type punchthrough suppression implant precedes the field oxidation step. After field oxidation, an implantation masking step is used to adjust the doping for the p-well in its active and field regions.

1 Claim, 5 Drawing Sheets

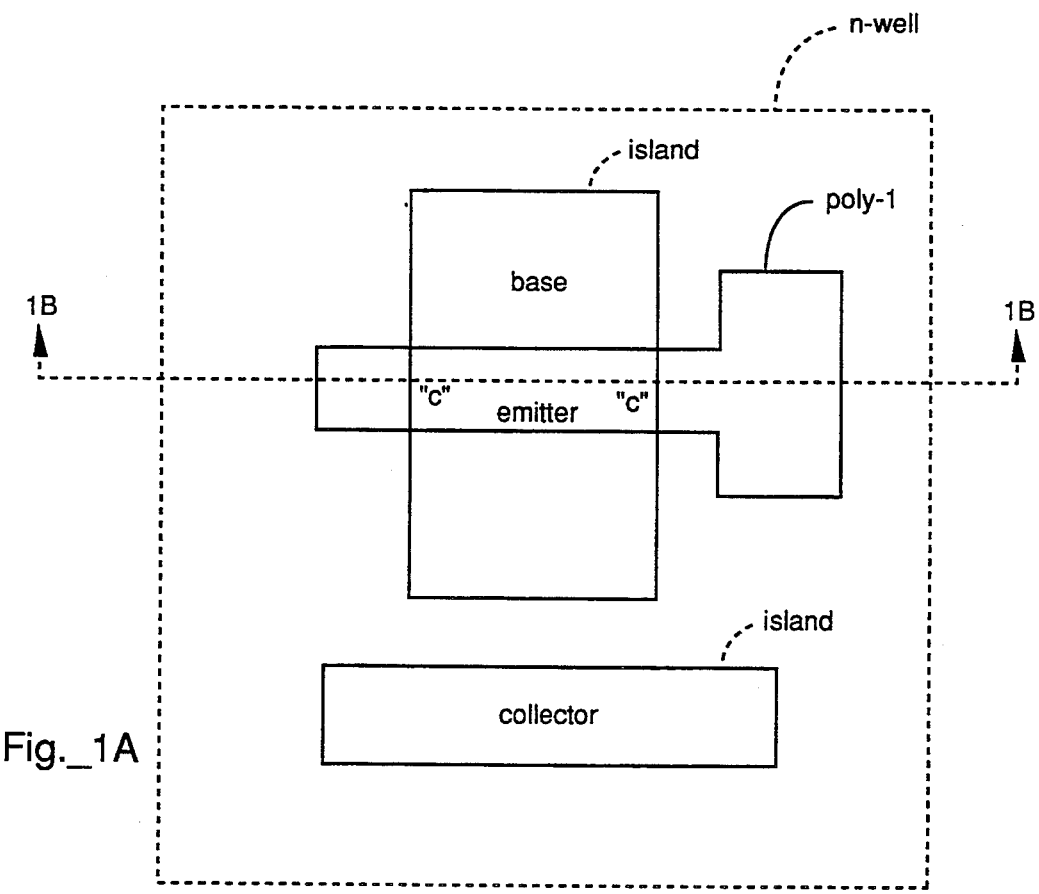
Fig._1A
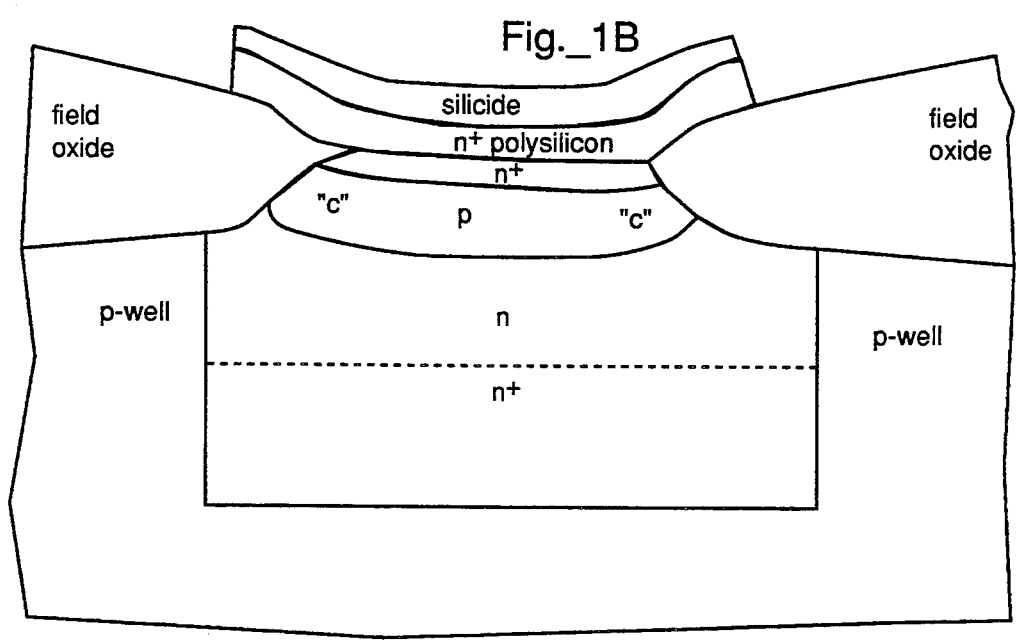
Fig._1B

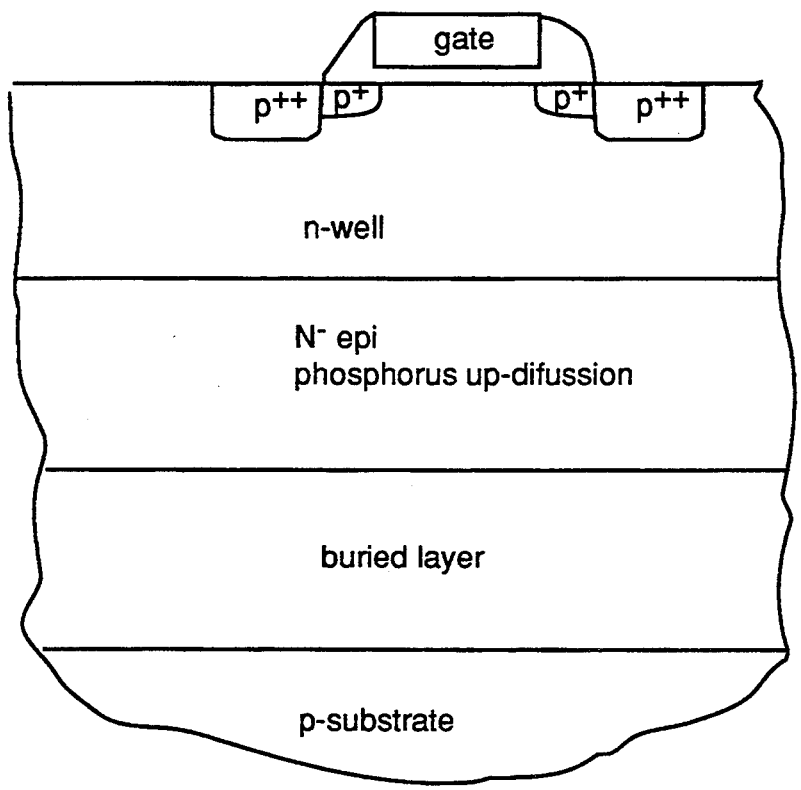
Fig. _2A
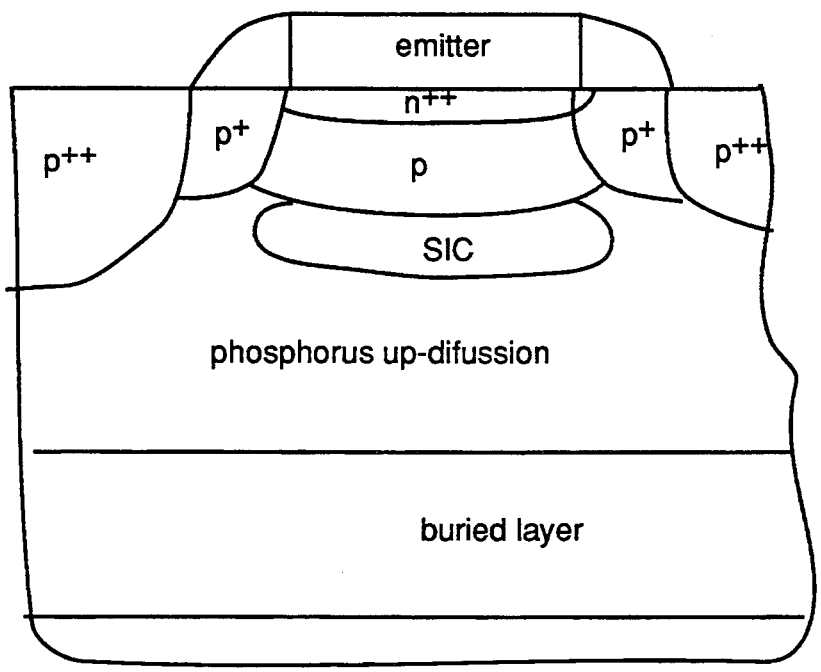
Fig. _2B

METHOD OF OPTIMIZING WELLS FOR PMOS AND BIPOLAR TO YIELD AN IMPROVED BICMOS PROCESS

This is a continuation of copending application(s) Ser. No. 07/835,249 filed on Feb. 13, 1992, now abandoned.

BACKGROUND OF THE INVENTION

1. Field of the Invention

The invention relates generally to semiconductor processing and more particularly to optimizing p-wells and n-wells for PMOS and bipolar which yield an improved BICMOS process.

2. Description of the Prior Art

BiCMOS is a semiconductor technology for high performance devices and is in widespread use. The term "BiCMOS" means there is a mixture of bipolar technology and CMOS technology in the same chip design. Using both technologies simultaneously has not been easy. Very often conflicts arise.

For example, both bipolar and PMOS use the same kind of n-well. To avoid a so-called "PMOS short channel effect," a reasonably high n-well concentration is needed around the surface area. To guarantee a good current drive of bipolar, the bottom of the n-well requires a high doping concentration. The doping concentration needs of the two technologies are at opposite ends.

Sharing of the n-wells themselves between PMOS and bipolar also presents problems. A high bottom-well concentration will increase any PMOS capacitances. A high top-well concentration will decrease the walled-emitter bipolar collector to emitter punchthrough voltage ($B_{vces}$). The latter effect will be exacerbated by n-type dopants, such as arsenic and/or phosphorus, that tend to "pile-up" in the silicon around the field oxide during field oxidation (see, FIGS. 1A and 1C, especially region labelled as "c"). The piled-up n-type dopants lower the effective base doping, which can cause punchthrough in these regions, because the base is so easily depleted.

In prior art "advanced" BiCMOS processes there are at least three kinds of process flows being commonly used. These and two process flows of the present invention are summarized in Table I. Only the prior art process flows A, B, and C will be discussed in this section. The process flows D and E/F are detailed below in the "detailed description of the embodiments of the present invention" section.

TABLE I

| FLOW A (prior art) | FLOW B (prior art) | FLOW C (prior art) | FLOW D present invention | FLOW E/F present invention |
|---|---|---|---|---|
| 2 masks p-well mask p-well implant | 2 masks n-well mask n-well implant | 2 masks n-well mask n-well implant | 1 mask .... | 2 masks n-well mask n-well implant |
| blanket/ self-aligned n-well implant | blanket/ self-aligned p-well implant | .... | blanket n-well implant | blanket n-well implant |
| .... | .... | .... | .... | .... |
| field mask field implant field oxide | field mask field implant field oxide | field oxide p-well/ field mask p-well/ field | field oxide p-well/ field mask p-well/ field | field oxide p-well/ field mask p-well/ field |

TABLE I-continued

| FLOW A (prior art) | FLOW B (prior art) | FLOW C (prior art) | FLOW D present invention | FLOW E/F present invention |
|---|---|---|---|---|
| .... | .... | .... | blanket n punchthru implant | .... |
| .... | .... | .... | .... | .... |

In flow "A", which requires two masks for the following described steps, an implant masking step is used for a p-well implant. An n-well implant is either blanket or self-aligned to the p-well, therefore eliminating a masking step. A masking step is used for a field implant. Each of these implantations precede field oxidation, and no high energy ($\geq 180$ Kev) implantation is required.

Flow "B", requires two masks for the following described steps, and is basically the same as flow "A", except that an n-well implant uses a masking step, while a p-well implant is blanket or self-aligned to the n-well Flow "C", also requires two masks for the following described steps, An n-well masking step is used for an n-well implant prior to field oxidation. After field oxidation, an implantation masking step is used to adjust p-well doping for the active as well as for the field regions. The p-well implant and field implant are combined together, which requires a high energy. Generally, a retrograded p-well will be formed with this flow type.

In all the above flows, two masking steps are required to define p-wells, n-wells, and field doping. And only one kind of an n-well is available.

Therefore, there is a need for process flows using n-wells that are optimized for both bipolar and PMOS and that have no more, and preferably fewer, masking steps.

SUMMARY OF THE PRESENT INVENTION

It is therefore an object of the present invention to provide a process flow with optimized n-wells for bipolar and PMOS that economizes on the number of masking steps.

Briefly, an embodiment of the present invention is a process comprising the steps of implanting a blanket low dose n-well implant before field oxidation. After field oxidation, an implantation masking step is used to adjust the doping for the p-well in its active and field regions. A blanket n-type punchthrough suppression implant follows the field oxidation step.

An advantage of the present invention is that it provides a process flow with optimized n-wells for bipolar and PMOS that economizes on the number of masking steps.

These and other objects and advantages of the present invention will no doubt become obvious to those of ordinary skill in the art after having read the following detailed description of the preferred embodiments which are illustrated in the various drawing figures.

IN THE DRAWINGS

FIG. 1A is a top view of a bipolar transistor. The regions plagued by punchthrough are indicated by "c";

FIG. 1B is a cross section of the transistor of FIG. 1A taken along the line 1B—1B FIG. 2A is a PMOS device in an n-well;

FIG. 2B shows a bipolar active area without a surface n-well but with a phosphorus up-diffusion and/or SIC;

DETAILED DESCRIPTION OF THE PREFERRED EMBODIMENTS

A first process embodiment of the present invention, flow "D" is summarized and compared in Table I. The device of FIG. 2A and 2B results from using flow "D," which comprises the steps of implanting a blanket low dose n-well implant before field oxidation. After field oxidation, an implantation masking step is used to adjust the doping for the p-well in its active and field regions. A blanket n-type punchthrough suppression implant follows the field oxidation step.

Only one masking step is therefore needed. The n-type dopant pile-up is reduced during field oxidation, since a lower n-well doping is used prior to field oxidation. The n-type punchthrough suppression implant can effectively suppress PMOS short channel effects with reduced P+/n-well junction capacitance. The n-type punchthrough suppression implant is compatible with bipolar doping and can be easily compensated for in the p-well for n-MOS. Also, a retrograded p-well is formed. For better bipolar performance, the bottom doping of the n-well can be increased, by phosphorus up-diffusion from the buried layer, a shallow implanted collector (SIC), or thin Si epi (FIGS. 2A and 2B) 0 All of these are not required, and they do not require additional masking steps.

A second process embodiment of the present invention, flow "E" is summarized and compared in Table I, under the column for flow "E/F". The device of FIG. 3A and 3B results from using flow "E," which comprises the steps of implanting a blanket low dose n-well implant and a masked n-well implant, prior to field oxidation. After field oxidation, adjusting doping for P-well and its field region with an implantation masking. Two masking steps are required to do this.

Figure 3A:
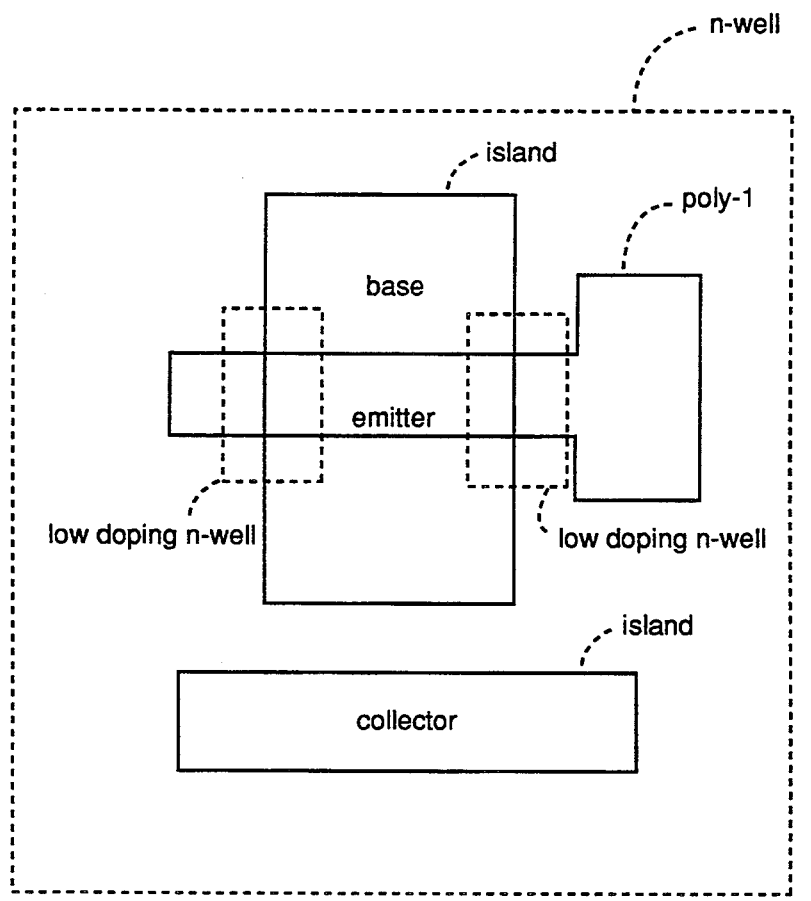
FIG. 3A is a top view of an n-well layout that has punchthrough regions "c" in a low doping n-well.
Figure 3B:
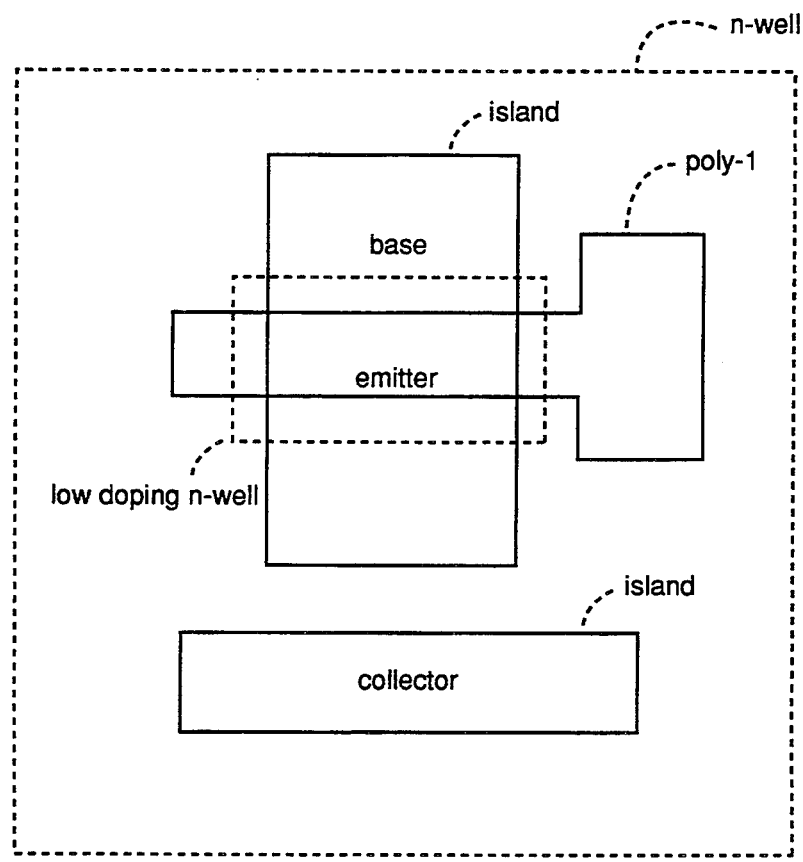
FIG. 3B is a layout of an n-well that has punchthrough regions "c" and active bipolar regions in the low doping n-well.

Thus, two kinds of n-well are available. A bipolar punchthrough region ("c" region) can be laid out in the low doping n-well to minimize the dopants pile-up, as shown in FIGS. 3A and 3B. All of the phosphorus up diffusion, the SIC, and the thin Si epi can also be combined here.

A third process embodiment of the present invention, flow "F" is summarized and compared in Table I, under the column for flow "E/F". The device of FIG. 3A and 3B, with the exception of changing "low doping n-well" to p-well, results from using flow "F," which comprises the steps of same as flow "E" except that the masked n-well implant is used for bipolar region only instead of PMOS region.

Figure 4A:
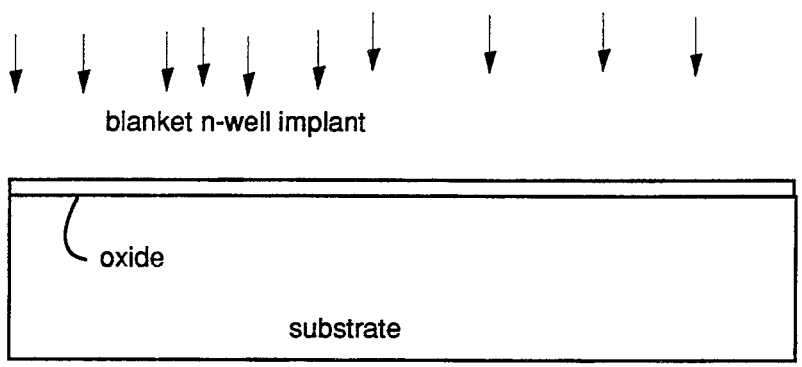
FIGS. 4A-4D are a sequence of cross sectional drawings of a device being fabricated with flow "D," according to an embodiment of the present invention.
Figure 4B:
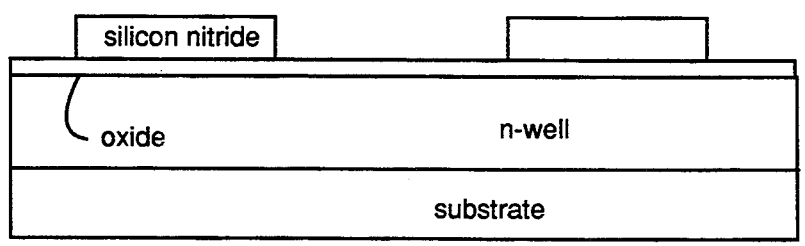
Figure 4C:
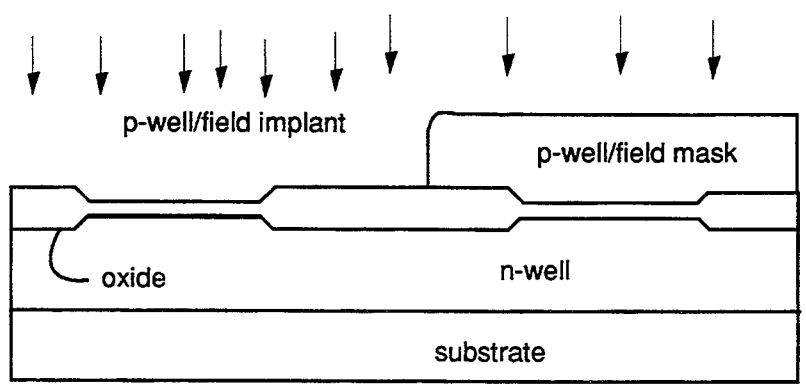
Figure 4D:
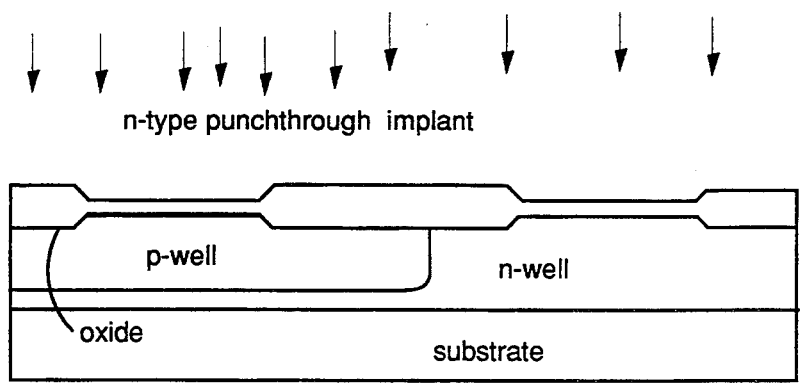

The sequence of fabricating with flow "D" is presented in FIGS. 4A-4D. In FIG. 4A, oxidation is followed by a blanket n-well implant. In FIG. 4B, the next steps are diffusion, nitride deposition, island mask, nitride etch, and photoresist strip. FIG. 4C shows an oxidation, nitride strip, p-well/field mask, p-well implant, and field implant. FIG. 4D has the steps of photoresist strip, diffusion, and an n-type punch through suppression implant.

Figure 5A:
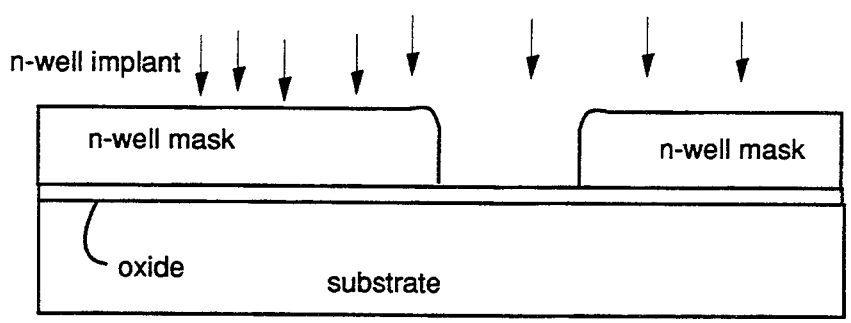
FIGS. 5A-5E are a sequence of cross sectional drawings of a device being fabricated with flow "E/F," according to an embodiment of the present invention.
Figure 5B:
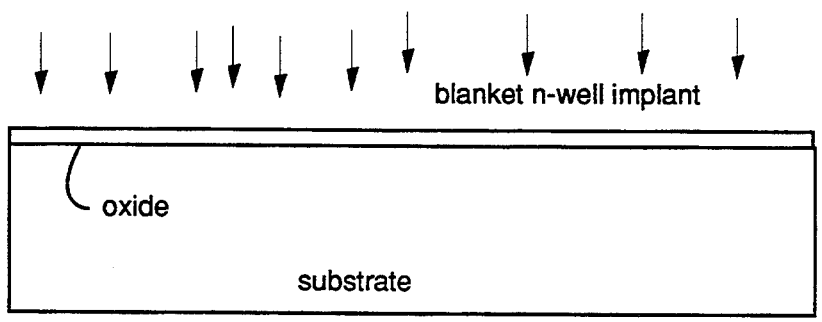
Figure 5C:
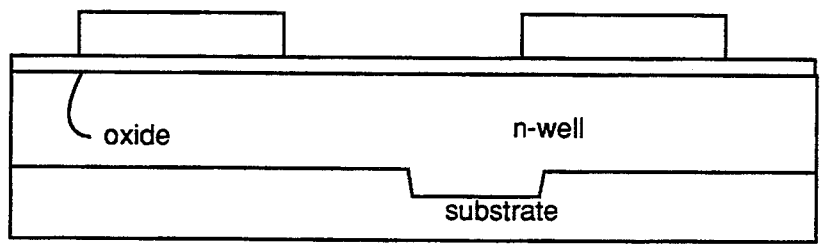
Figure 5D:
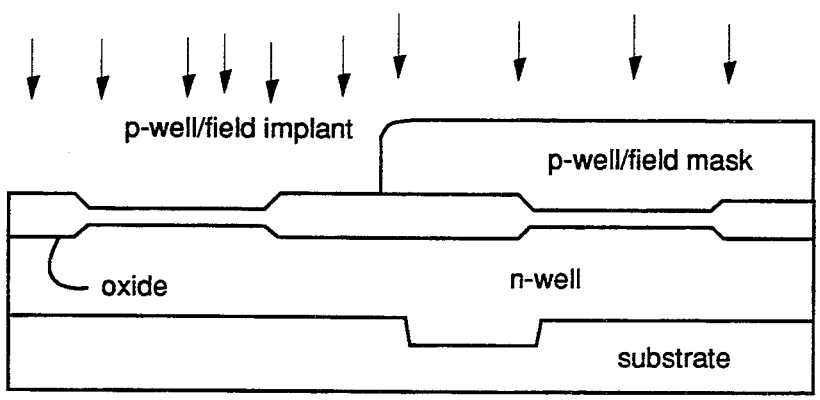
Figure 5E:
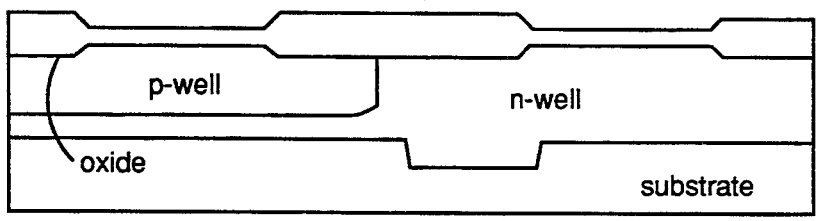

The sequence of fabricating with flow "E/F" is presented in FIGS. 5A-5E. In FIG. 5A, oxidation is followed by an n-well mask, and an n-well implant. In FIG. 5B, the next steps are photoresist strip and n-well implant. FIG. 5C shows diffusion, nitride deposition, island mask, nitride etch, and photoresist strip steps. FIG. 5D has the steps of oxidation, nitride strip, p-well/field mask, p-well implant, and field implant. In FIG. 5E, there is a photoresist strip and a diffusion.

With flows A to E, the bipolar punchthrough region "c" in p-well can be laid out. In this case, phosphorus up-diffusion or SIC or thin Si epi becomes mandatory. Of course, all the proposed flows can be used in pure CMOS process.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A semiconductor process, comprising the steps of:
   oxidizing a surface of a wafer;
   implanting a blanket n-well implant in said wafer through said oxidized wafer surface before any field oxidation of said wafer;
   diffusing said n-well implant in said wafer;
   depositing nitride layers on said wafer surface;
   masking said wafer with an island-like pattern of photoresist;
   etching said nitride layers into patterned islands of nitride;
   stripping any remaining portions of said photoresist on said wafer;
   oxidizing said surface of said wafer;
   stripping away any remaining portions of said nitride layers;
   masking with another photoresist patterned for placing a p-well and a field oxide in said wafer;
   implanting said p-well implant in said wafer wherein a retrograded p-well is formed;
   field implanting said field oxide in said wafer;
   stripping away any remaining portions of said photoresist off said wafer;
   implanting an n-type punch through suppression implant in said wafer.

* * * * *